United States Patent
Lv et al.

(10) Patent No.: US 12,197,256 B2
(45) Date of Patent: Jan. 14, 2025

(54) DISPLAY ASSEMBLY AND ELECTRONIC DEVICE

(71) Applicant: HUAWEI TECHNOLOGIES CO., LTD., Guangdong (CN)

(72) Inventors: Chengling Lv, Dongguan (CN); Cong Huang, Dongguan (CN); Wenhong Chen, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 181 days.

(21) Appl. No.: 17/801,060

(22) PCT Filed: Jan. 25, 2021

(86) PCT No.: PCT/CN2021/073535
§ 371 (c)(1),
(2) Date: Aug. 19, 2022

(87) PCT Pub. No.: WO2021/169697
PCT Pub. Date: Sep. 2, 2021

(65) Prior Publication Data
US 2023/0082293 A1    Mar. 16, 2023

(30) Foreign Application Priority Data
Feb. 29, 2020 (CN) .......................... 202020235494.2

(51) Int. Cl.
*G06F 1/16* (2006.01)
(52) U.S. Cl.
CPC .......... *G06F 1/1656* (2013.01); *G06F 1/1616* (2013.01); *G06F 1/1652* (2013.01)
(58) Field of Classification Search
CPC .... G06F 1/1616; G06F 1/1652; G06F 1/1656; G09F 9/301; H04M 1/0268; H10K 2102/311; H10K 77/111
See application file for complete search history.

(56) References Cited

U.S. PATENT DOCUMENTS 10,074,824 B2 * 9/2018 Han ...................... G06F 1/1652
10,164,208 B2 * 12/2018 Lee ........................... B32B 3/30
(Continued)

FOREIGN PATENT DOCUMENTS

CN        109032251 A    12/2018
CN        109360499 A    2/2019
(Continued)

*Primary Examiner* — Rockshana D Chowdhury
*Assistant Examiner* — Martin Antonio Asmat Uceda

(57) ABSTRACT

This application provides a display assembly and an electronic device. The display assembly includes a display screen and a support member. The support member is fastened to a non-display side of the display screen. A first metal plate is disposed facing a first non-bending region. A second metal plate is disposed facing a bending region. A third metal plate is disposed facing a second non-bending region. The second metal plate is capable of being bent. At least two first elongated through hole groups of the second metal plate are arranged in a first direction. Each first elongated through hole of each first elongated through hole group extends in the first direction. A plurality of first elongated through holes in a same first elongated through hole group are arranged at intervals in a second direction. In the first direction, a sum of lengths of a first end part and a second end part of the first elongated through hole is less than a length of the middle part of the first elongated through hole. In the second direction, widths of the first end part and the second end part are both greater than a width of the middle part. The display assembly and the electronic device have the support member that is easily folded and has sufficient support strength.

18 Claims, 11 Drawing Sheets

(56) References Cited

U.S. PATENT DOCUMENTS

| | | | |
|---|---|---|---|
| 11,503,727 B2 * | 11/2022 | Seo | H05K 5/0017 |
| 11,508,922 B2 * | 11/2022 | Park | H10K 77/111 |
| 11,635,784 B2 * | 4/2023 | Wang | G06F 1/1652 |
| | | | 361/679.01 |
| 2014/0132553 A1 | 5/2014 | Park et al. | |
| 2017/0060188 A1 | 3/2017 | Han et al. | |
| 2017/0294495 A1 * | 10/2017 | Shyu | H10K 59/35 |
| 2018/0070460 A1 | 3/2018 | Han | |
| 2018/0097197 A1 * | 4/2018 | Han | H05K 5/03 |
| 2018/0348916 A1 | 12/2018 | Park et al. | |
| 2019/0141843 A1 | 5/2019 | Park et al. | |
| 2019/0207141 A1 | 7/2019 | Kim et al. | |
| 2020/0008308 A1 | 1/2020 | Shin et al. | |
| 2020/0047451 A1 | 2/2020 | Dong et al. | |
| 2020/0137907 A1 * | 4/2020 | Kang | H05K 5/0017 |
| 2021/0165454 A1 * | 6/2021 | Dong | G06F 1/1652 |
| 2021/0259119 A1 * | 8/2021 | Seo | H05K 5/0217 |
| 2022/0147107 A1 * | 5/2022 | Wang | G06F 1/1637 |
| 2023/0050666 A1 * | 2/2023 | Li | G06F 1/1681 |

FOREIGN PATENT DOCUMENTS

| | | |
|---|---|---|
| CN | 211481295 U | 9/2020 |
| CN | 110767096 B | 12/2021 |
| RU | 105061 U1 | 5/2011 |
| RU | 2596469 C2 | 9/2016 |
| WO | 2019223124 A1 | 11/2019 |
| WO | 2019237484 A1 | 12/2019 |

\* cited by examiner

DISPLAY ASSEMBLY AND ELECTRONIC DEVICE

This application is a national stage of International Application No. PCT/CN2021/073535, filed on Jan. 25, 2021, which claims priority to Chinese Patent Application No. 202020235494.2, filed on Feb. 29, 2020. Both of the aforementioned applications are hereby incorporated by reference in their entireties.

TECHNICAL FIELD

This application relates to the field of electronic device technologies, and in particular, to a display assembly and an electronic device.

BACKGROUND

A flexible display screen has advantages of being light, thin, non-fragile, and foldable and rollable. Therefore, the flexible display is screen widely used in electronic products such as a mobile phone. However, in a conventional mobile phone, hardness of a flexible display screen is poor, and a surface collapse phenomenon is prone to occur. Therefore, a support sheet is disposed at the bottom of the conventional flexible display screen to support the flexible display screen, so that a surface collapse problem of the flexible display screen is resolved. However, when the support sheet is relatively thick, the support sheet restricts the flexible display screen from bending, and it is difficult for the mobile phone to be folded. When the support sheet is relatively thin, although the support sheet does not restrict the flexible display screen from bending, the excessively thin support sheet has insufficient structural strength, and cannot appropriately support the flexible display screen.

SUMMARY

This application provides a display assembly and an electronic device that have a support member that is easily folded and has sufficient support strength.

According to a first aspect, this application provides a display assembly. The display assembly includes a display screen and a support member. The display screen includes a first non-bending region, a bending region, and a second non-bending region that are sequentially connected. In other words, the bending region is connected between the first non-bending region and the second non-bending region. The support member is fastened to a non-display side of the display screen. The support member includes a first metal plate, a second metal plate, and a third metal plate that are sequentially connected. The second metal plate is connected between the first metal plate and the third metal plate. The first metal plate is disposed facing the first non-bending region. The second metal plate is disposed facing the bending region. The third metal plate is disposed facing the second non-bending region. The second metal plate is capable of being bent.

The second metal plate is provided with at least two first elongated through hole groups. The at least two first elongated through hole groups are arranged in a first direction. Each first elongated through hole group includes a plurality of first elongated through holes. Each first elongated through hole extends in the first direction. A plurality of first elongated through holes in a same first elongated through hole group are arranged at intervals in a second direction, and the second direction is different from the first direction.

Each first elongated through hole includes a first end part, a middle part, and a second end part that sequentially traverse through. In the second direction, widths of the first end part and the second end part are both greater than a width of the middle part.

It may be understood that the second metal plate is provided with the at least two first elongated through hole groups, and each first elongated through hole group includes the plurality of first elongated through holes, so that excessive stress concentration of the second metal plate is avoided, to ensure that the second metal plate has better flexibility. In other words, in a process of unfolding or folding an electronic device, because the second metal plate has better flexibility, the second metal plate has less impact on bending of the display screen.

In this implementation, when the first elongated through hole is disposed in an approximate dumbbell shape, on one hand, because the width of the middle part of the first elongated through hole is relatively narrow, there is a relatively large quantity of remaining materials between two adjacent first elongated through holes in the second direction. In this way, the second metal plate has sufficient strength. On another hand, because the widths of the first end part and the second end part are relatively wide, even if the width of the middle part is relatively narrow, a volume of the first elongated through hole is not reduced. In this way, when the second metal plate has sufficient strength, the flexibility of the second metal plate does not significantly decrease. In other words, hardness of the second metal plate in this embodiment is moderate. It may be understood that, when the electronic device is in an open state, the second metal plate has sufficient hardness to support the bending region of the display screen, to prevent the bending region of the display screen from collapsing, that is, ensure that the display screen has better surface flatness. In the process of unfolding or folding the electronic device, because the second metal plate has better flexibility, the second metal plate has less impact on the bending of the display screen.

In addition, a first support plate, a second support plate, and a third support plate of a rotating apparatus are generally provided with a plurality of grooves or through holes. The groove or the through hole may be used as a shelter for a component or configured to lock a fastener. When the electronic device is in the open state, if a user presses the screen, peripheral edges of the grooves or the through holes on the first support plate, the second support plate, and the third support plate of the rotating apparatus are prone to squeeze the second metal plate. Because stress of the peripheral edges of the grooves or the through holes is concentrated, a peripheral edge of the elongated through hole can squeeze an optical clear adhesive with large squeezing force, the optical clear adhesive protrudes, and the display screen is prone to have problems such as a black spot or a bright line. In this case, when the second metal plate has sufficient strength, the second metal plate can resist the squeezing force, on the second metal plate, of the peripheral edges of the grooves or the through holes. Therefore, the optical clear adhesive is prevented from protruding due to excessive squeezing, thereby avoiding the display screen having the problems such as the black spot or the bright line.

In an implementation, in the first direction, a length of the first end part is less than a length of the middle part. A length of the second end part is less than the length of the middle part.

In this implementation, the length of the middle part of the first elongated through hole is relatively long, and the lengths of the first end part and the second end part are both relatively short. Therefore, the quantity of remaining materials between two adjacent first elongated through holes in the second direction further increases. In this way, the strength of the second metal plate is better. In this case, when the second metal plate has sufficient strength, the second metal plate can resist the squeezing force, on the second metal plate, of the peripheral edges of the grooves or the through holes. Therefore, the optical clear adhesive is prevented from protruding due to the excessive squeezing, thereby avoiding the display screen having the problems such as the black spot or the bright line.

In an implementation, the middle part is a strip-shaped hole. The first end part and the second end part are both circular holes. In this case, a preparation process of the first elongated through hole is simple and is easy to operate.

In an implementation, in the second direction, the widths of the first end part and the second end part both range from 0.15 mm to 0.3 mm. The width of the middle part ranges from 0.1 mm to 0.2 mm. In the first direction, the lengths of the first end part and the second end part both range from 0.15 mm to 3 mm. The length of the middle part ranges from 4.5 mm to 6.5 mm. It may be understood that, with the first elongated through hole in this size, the second metal plate has both better flexibility and better strength.

In an implementation, in the second direction, a width of a spacing part between two adjacent first elongated through holes of the second metal plate ranges from 0.2 mm to 0.3 mm. In this way, in the second direction, there is a relatively large quantity of remaining materials between two adjacent first elongated through holes, thereby ensuring that the second metal plate has better strength.

In an implementation, in the first direction, a length of a spacing part between two adjacent first elongated through holes of the second metal plate ranges from 0.4 mm to 0.6 mm.

It may be understood that, in the first direction, there is a relatively large quantity of remaining materials between two adjacent first elongated through holes, thereby ensuring that the second metal plate has better strength. In this case, when the peripheral edges of the grooves or the through holes on the first support plate, the second support plate, and the third support plate of the rotating apparatus squeeze the second metal plate, the second metal plate has sufficient strength to resist the squeezing force, on the second metal plate, of the peripheral edges of the grooves or the through holes. Therefore, the optical clear adhesive is prevented from protruding due to the excessive squeezing, thereby avoiding the display screen having the problems such as the black spot or the bright line.

In an implementation, a plurality of first elongated through holes of two adjacent first elongated through hole groups are disposed in a cross manner. In this way, when sections are made in a Y-axis direction at most positions on the second metal plate, the second metal plate is divided into a plurality of parts by the first elongated through holes. In other words, the second metal plate has no continuous part. In this case, the flexibility of the second metal plate is further improved. In this way, in the process of unfolding or folding the electronic device, the second metal plate has better flexibility, and the second metal plate has less impact on the bending of the display screen.

In an implementation, the second metal plate is provided with two second elongated through hole groups. Each second elongated through hole group includes a plurality of second elongated through holes extending in the first direction. A plurality of second elongated through holes in a same second elongated through hole group are arranged at intervals in the second direction. In the first direction, the second metal plate includes a first side surface and a second side surface that are disposed opposite to each other. One second elongated through hole group is disposed close to the first side surface, and each second elongated through hole penetrates the first side surface. Another second elongated through hole group is disposed close to the second side surface, and each second elongated through hole penetrates the second side surface.

It may be understood that the second metal plate is provided with the two second elongated through hole groups, and each second elongated through hole group includes the plurality of second elongated through holes, so that the excessive stress concentration of the second metal plate is further avoided, thereby ensuring that the second metal plate has better flexibility. In other words, in the process of unfolding or folding the electronic device, because the second metal plate has better flexibility, the second metal plate has less impact on the bending of the display screen.

In addition, each second elongated through hole of the one second elongated through hole group penetrates the first side surface of the second metal plate, and each second elongated through hole of the another second elongated through hole group penetrates the second side surface of the second metal plate, so that local stress concentration on a side part of the second metal plate is prevented. In this case, in the process of unfolding or folding the electronic device, the second elongated through hole can absorb stress of the display assembly in a bending process. In other words, this avoids that the display assembly is difficultly bent due to excessive stress on the side part of the second metal plate.

In an implementation, each second elongated through hole includes a third end part and a main part that traverse through with each other. The main part penetrates the first side surface or the second side surface. In the second direction, a width of the third end part is greater than a width of the main part.

In this implementation, when the second elongated through hole is disposed in an approximate match shape, on one hand, because the width of the main part of the second elongated through hole is relatively narrow, there is a relatively large quantity of remaining materials between the second elongated through hole and an adjacent first elongated through hole in the second direction. In this way, the strength of the second metal plate is further improved. On another hand, because the width of the third end part is relatively wide, even if the width of the main part is relatively narrow, a volume of the second elongated through hole is not reduced. In this way, when the second metal plate has sufficient strength, the flexibility of the second metal plate does not significantly decrease.

In an implementation, in the first direction, a length of the third end part is less than a length of the main part. In this implementation, the length of the main part of the second elongated through hole is relatively long, and the length of the third end part is relatively short. Therefore, the quantity of remaining materials between two adjacent second elongated through holes in the second direction further increases. In this way, the strength of the second metal plate is better. In this way, when the second metal plate has sufficient strength, the second metal plate can resist the squeezing force, on the second metal plate, of the peripheral edges of the grooves or the through holes. Therefore, the optical clear adhesive is prevented from protruding due to the excessive squeezing, thereby avoiding the display screen having the problems such as the black spot or the bright line.

In an implementation, the support member further includes a fourth metal plate and a fifth metal plate that face the bending region of the display screen. The first metal plate, the fourth metal plate, the fifth metal plate, the second metal plate, and the third metal plate are sequentially connected. The fourth metal plate is provided with at least two first elongated through hole groups.

In this implementation, because the fourth metal plate is provided with a plurality of first elongated through hole groups, overall hardness and rigidity of the fourth metal plate are moderate. In other words, some regions of the support member have better flexibility. In this case, a quantity of regions of the support member that have better flexibility may increase. Therefore, when the support member is fastened to the display screen, the fourth metal plate may be fastened to a region with a larger bending angle in the bending region of the display screen, to ensure that the bending region of the display screen has a better bending effect. In addition, the fifth metal plate may be fastened to a region with a smaller bending angle in the bending region of the display screen, to ensure that the support member has sufficient strength to support the display screen.

In an implementation, a thickness of the support member ranges from 0.1 mm to 0.5 mm. In this case, the thickness of the support member is moderate, so that the support member has better rigidity and flexibility, and the support member does not greatly increase a thickness of the display assembly.

In an implementation, the support member further includes buffers. The buffers are disposed in the first elongated through holes, and are connected to the second metal plate.

It may be understood that, when the peripheral edges of the grooves or the through holes on the first support plate, the second support plate, and the third support plate of the rotating apparatus squeeze the second metal plate, the buffer can absorb squeezing force, on the second metal plate, of peripheral edges of some grooves or through holes. Therefore, the optical clear adhesive is prevented from protruding due to the excessive squeezing, thereby avoiding the display screen having the problems such as the black spot or the bright line.

In addition, no hollow region due to the first elongated through hole exists on the support member, so that the support member has high integrity. In this way, the support member has sufficient strength to resist the squeezing force, on the second metal plate, of the peripheral edges of the grooves or the through holes. Therefore, the optical clear adhesive is prevented from protruding due to the excessive squeezing, thereby avoiding the display screen having the problems such as the black spot or the bright line.

According to a second aspect, this application provides an electronic device. The electronic device includes a first housing, a second housing, and the display assembly described above. The first non-bending region of the display screen of the display assembly is fastened to the first housing. The second non-bending region is fastened to the second housing. The first housing and the second housing can be folded relative to each other to a closed state, or unfolded relative to each other to an open state. When the first housing and the second housing are in the closed state, the bending region and the second metal plate are bent.

In this implementation, the support member has advantages of being easily folded and having sufficient support strength. When the support member is used in the display assembly and the electronic device, the display assembly and the electronic device are also easily folded and have stable overall strength.

DESCRIPTION OF EMBODIMENTS

Figure 1:
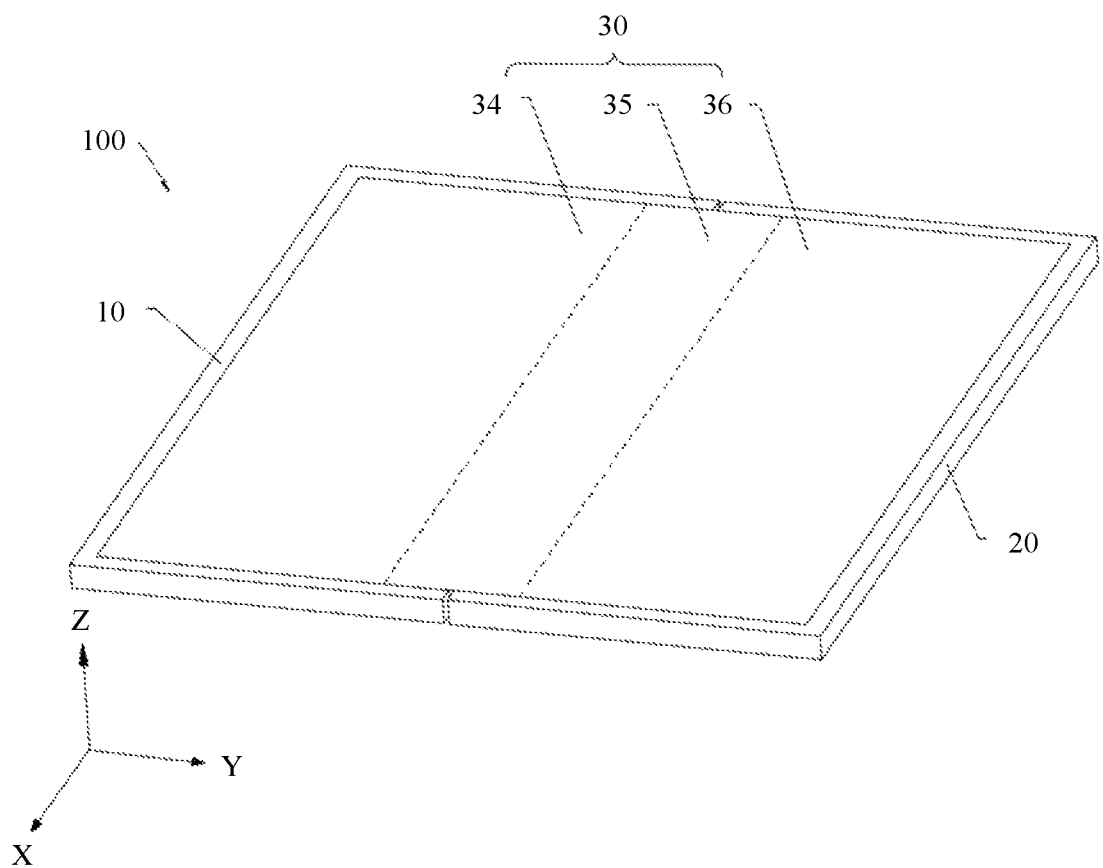
FIG. 1 is a schematic diagram of a structure of an electronic device in an open state according to an embodiment of this application.

FIG. 1 is a schematic diagram of a structure of an electronic device in an open state according to an embodiment of this application. An electronic device 100 may be a tablet computer, a mobile phone, a camera, a personal computer, a notebook computer, a vehicle-mounted device, or a wearable device. In the embodiment shown in FIG. 1, the electronic device 100 is described by using the mobile phone as an example. For ease of description, as shown in FIG. 1, a width direction of the electronic device 100 is defined as an X axis. A length direction of the electronic device 100 is a Y axis. A thickness direction of the electronic device 100 is a Z axis.

Figure 2:
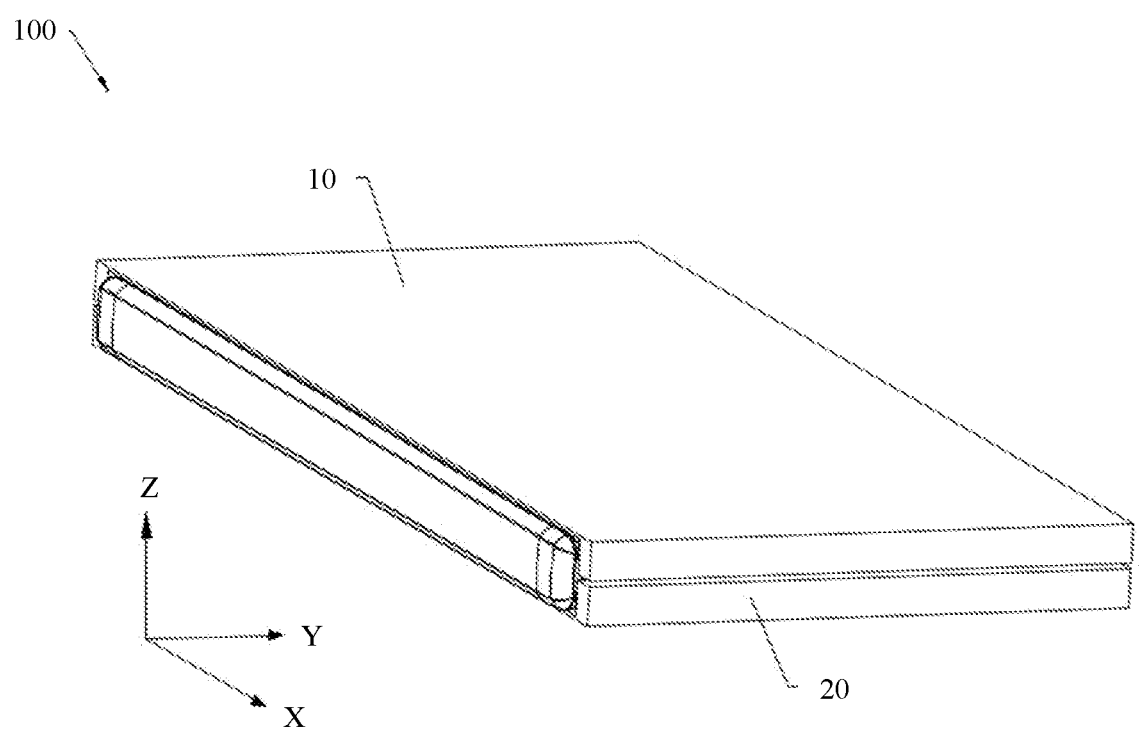
FIG. 2 is a schematic diagram of a structure of the electronic device shown in FIG. 1 in a closed state.

With reference to FIG. 2 together with FIG. 1, FIG. 2 is a schematic diagram of a structure of the electronic device shown in FIG. 1 in a closed state.

The electronic device 100 includes a first housing 10, a second housing 20, and a display assembly 30. The first housing 10 and the second housing 20 can be unfolded relative to each other to be in an open state. The first housing 10 and the second housing 20 can alternatively be folded relative to each other to be in a closed state. In other words, the first housing 10 and the second housing 20 can be switched between the closed state and the open state. FIG. 1 shows that the electronic device 100 is in the open state. FIG. 2 shows that the electronic device 100 is in the closed state. In this application, an example in which the first housing 10 and the second housing 20 are unfolded and folded relative to an X-axis direction is used for description.

In addition, the display assembly 30 may be configured to display an image, a text, a video, and the like. The display assembly 30 includes a first part 34, a second part 35, and a third part 36 that are sequentially connected. The second part 35 is connected between the first part 34 and the third part 36. The first part 34, the second part 35, and the third part 36 are located on a same side of the first housing 10 and the second housing 20. In addition, the first part 34 is fastened to the first housing 10. The second part 35 is located between the first housing 10 and the second housing 20. The third part 36 is fastened to the second housing 20. The first part 34, the second part 35, and the third part 36 are arranged in a Y-axis direction. The second part 35 can be bent along the X axis.

It may be understood that, when the electronic device 100 is in the open state, the first part 34, the second part 35, and the third part 36 are approximately at 180° (where a slight deviation is allowed, for example, 165°, 177°, or 185°). In this case, the display assembly 30 has a continuous large-area display region. In other words, the display assembly 30 can implement large-screen display. Therefore, user experience is better. When the electronic device 100 is in the closed state, the display assembly 30 is folded. Specifically, the second part 35 is bent. The first part 34 and the third part 36 superimpose each other. In this case, an unfolded area of the display assembly 30 is relatively small, and this helps reduce a probability of damage to the display assembly 30.

In addition, FIG. 2 shows that, when the electronic device 100 is in the closed state, the display assembly 30 is located between the first housing 10 and the second housing 20. In other words, the display assembly 30 can be folded inward. In another implementation, when the electronic device 100 is in the closed state, the first housing 10 and the second housing 20 may alternatively be located between the first part 34 and the third part 36. In other words, the display assembly 30 may be folded outward.

In addition, FIG. 1 and FIG. 2 both show that the electronic device 100 may be folded once. In another implementation, the electronic device 100 may alternatively be folded for a plurality of times. In other words, the display assembly 20 may include a plurality of parts. Every two parts may be folded relative to each other.

Figure 3:
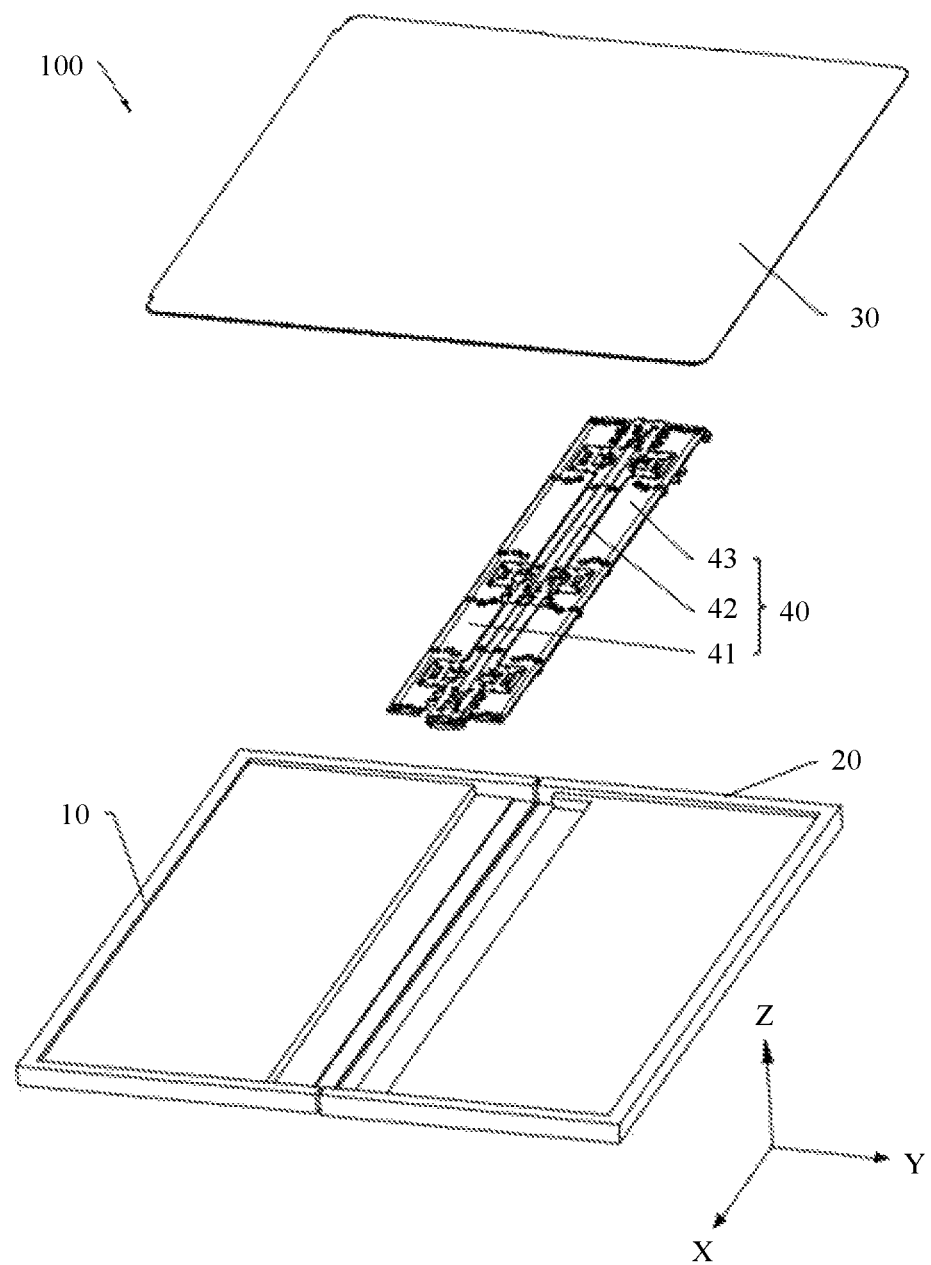
FIG. 3 is a partial schematic exploded view of the electronic device shown in FIG. 1.
Figure 4:
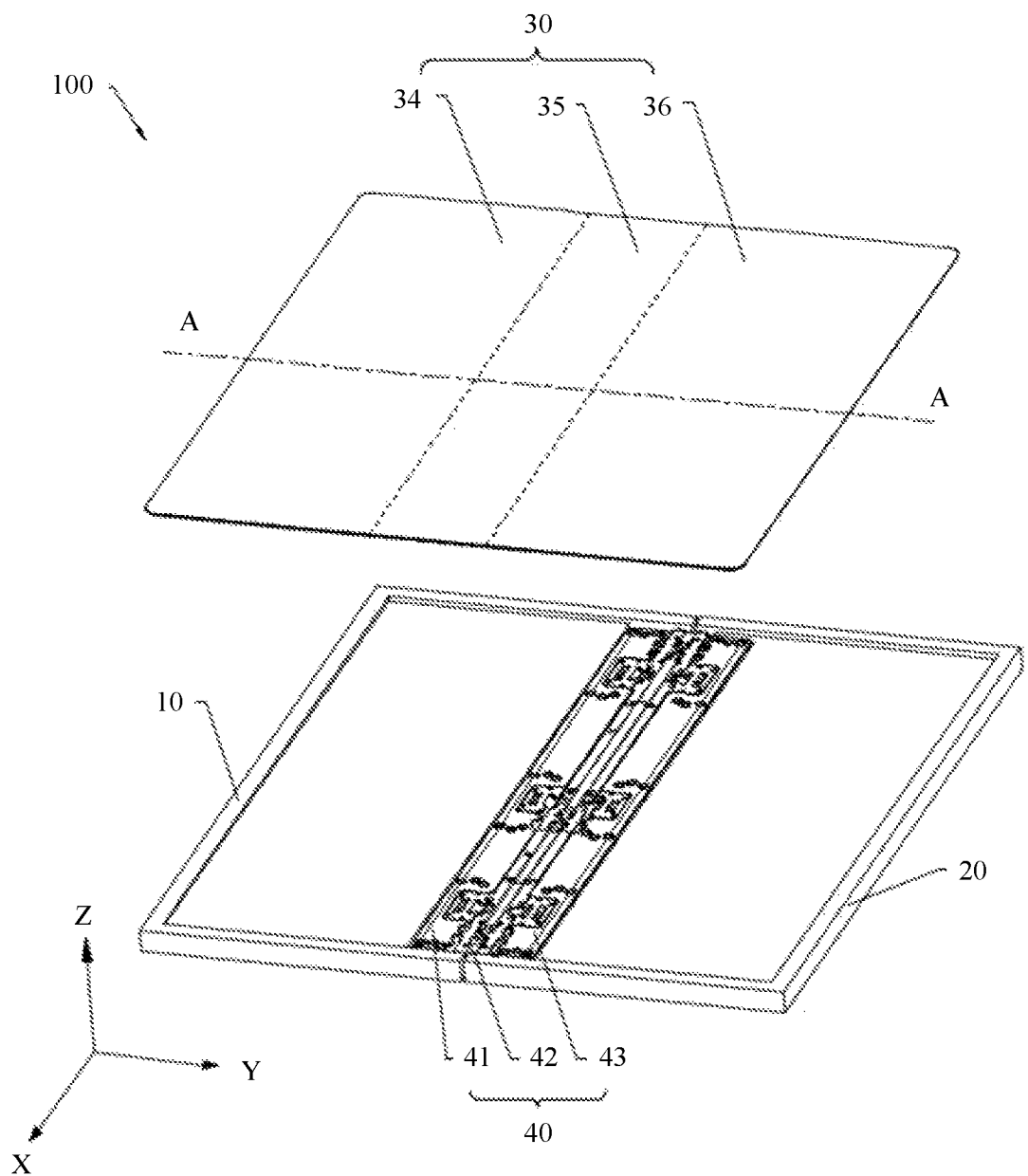
FIG. 4 is a schematic diagram in which a rotating apparatus of the electronic device shown in FIG. 3 is mounted on a first housing and a second housing.

It may be understood that the first housing 10 and the second housing 20 have a plurality of connection relationships, for example, a rotatable connection, a slidable connection, a rotatable and slidable connection, and a detachable fastening connection. In this embodiment, an example in which the first housing 10 is rotatably connected to the second housing 20 is used for description. Referring to FIG. 3 and FIG. 4, FIG. 3 is a partial schematic exploded view of the electronic device 100 shown in FIG. 1. FIG. 4 is a schematic diagram in which a rotating apparatus of the electronic device shown in FIG. 3 is mounted on the first housing and the second housing. The electronic device 100 further includes a rotating apparatus 40. The rotating apparatus 40 is rotatably connected to the first housing 10 and the second housing 20. The rotating apparatus 40 enables the first housing 10 and the second housing 20 to rotate relative to each other for folding or unfolding. The rotating apparatus 40 is located between the first housing 10 and the second housing 20, and the rotating apparatus 40 is disposed opposite to the second part 35 of the display assembly 30.

The rotating apparatus 40 includes a first support plate 41, a second support plate 42, and a third support plate 43. The second support plate 42 is located between the first support plate 41 and the third support plate 43. In addition, the first support plate 41, the second support plate 42, and the third support plate 43 are disposed facing the second part 35 of the display assembly 30.

In addition, one side of the second support plate 42 is movably connected to the first support plate 41. The other side of the second support plate 42 is also movably connected to the third support plate 43. It may be understood that the movable connection may be a rotatable connection, a slidable connection, a rotatable and slidable connection, or a detachable fastening connection. In other words, the first support plate 41, the second support plate 42, and the third support plate 43 are movable with each other. In addition, one side, away from the second support plate 42, of the first support plate 41 is rotatably connected to the first housing 10. One side, away from the second support plate 42, of the third support plate 43 is rotatably connected to the second housing 20. In this case, the first supporting plate 41, the second supporting plate 42, and the third supporting plate 43 cooperate with each other, and the first housing 10 and the second housing 20 can rotate relative to each other for folding or unfolding.

It may be understood that, when the electronic device 100 is unfolded to the open state, the first support plate 41, the second support plate 42, and the third support plate 43 jointly support the second part 35 of the display assembly 30.

Figure 5:
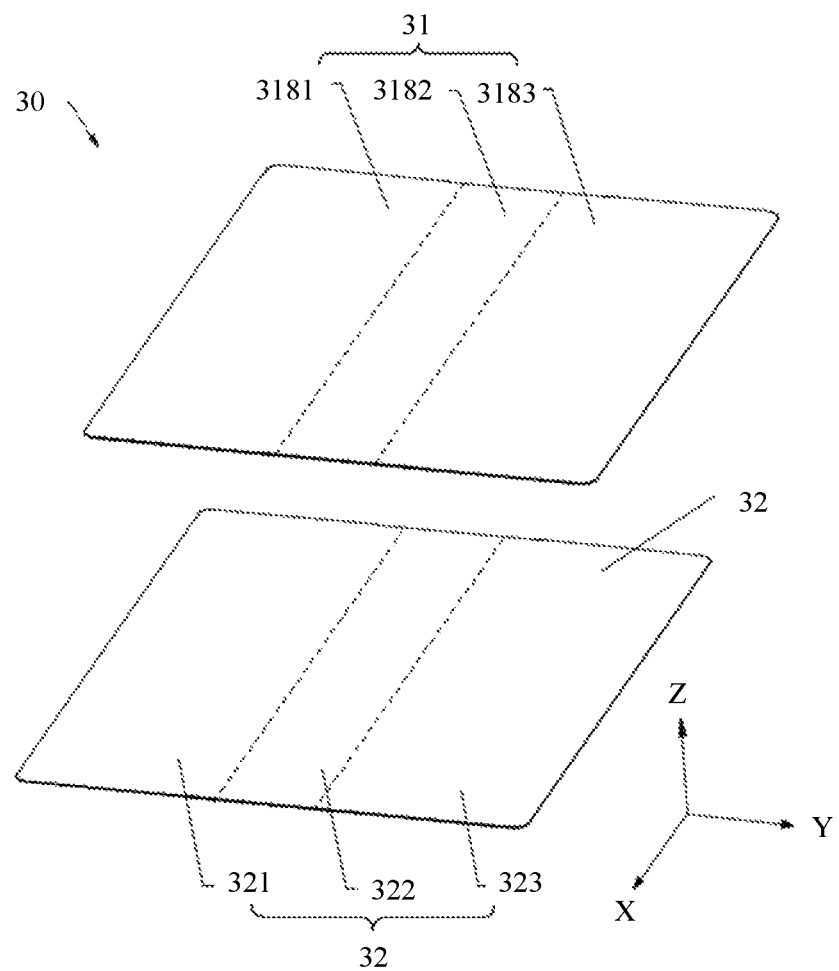
FIG. 5 is a schematic exploded view of a display assembly of the electronic device shown in FIG. 4.

Referring to FIG. 5, FIG. 5 is a schematic exploded view of the display assembly of the electronic device shown in FIG. 4. The display assembly 30 includes a display screen 31 and a support member 32. The display screen 31 is configured to display an image, a text, a video, and the like. The display screen 31 is a flexible display screen. For example, the display screen 31 may be an organic light-emitting diode (organic light-emitting diode, OLED) display screen, an active-matrix organic light-emitting diode (active-matrix organic light-emitting diode, AMOLED) display screen, a mini light-emitting diode (mini light-emitting diode) display screen, a micro light-emitting diode (micro organic light-emitting diode) display screen, a micro organic light-emitting diode (micro organic light-emitting diode) display screen, or a quantum dot light-emitting diode (quantum dot light emitting diode, QLED) display screen.

Referring to FIG. 5 together with FIG. 4, the display screen 31 includes a first non-bending region 3181, a bending region 3182, and a second non-bending region 3183 that are sequentially connected. In other words, the bending region 3182 is connected between the first non-bending region 3181 and the second non-bending region 3183. The first non-bending region 3181 is a part of the first part 34 of the display assembly 30. The bending region 3182 is a part of the second part 35. The second non-bending region 3183 is a part of the third part 36. The bending region 3182 is capable of being bent.

Figure 6:
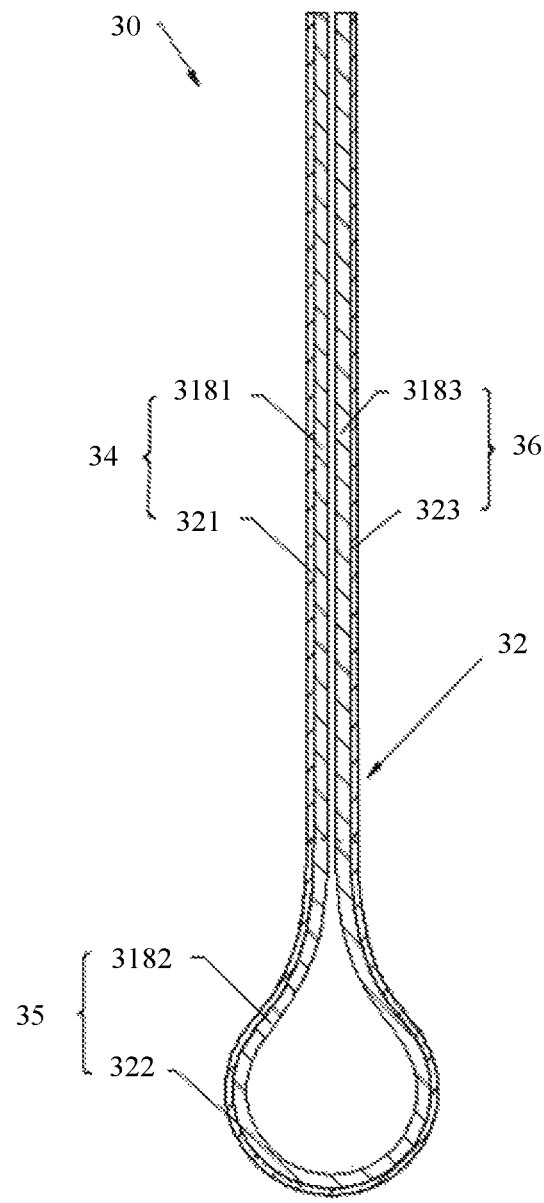
FIG. 6 is a schematic sectional view of a display assembly of the electronic device shown in FIG. 4 in a closed state.

Referring to FIG. 6, FIG. 6 is a schematic diagram of the display assembly of the electronic device shown in FIG. 4 in a closed state. When the electronic device 100 is in the closed state, the bending region 3182 is bent, the first non-bending region 3181 and the second non-bending region 3183 are disposed facing each other, and the first non-bending region 3181 partially or completely overlaps the second non-bending region 3183. FIG. 6 shows that the bending region 3182 is approximately water drop-shaped. In another implementation, the bending region 3182 may alternatively be semi-annular.

Figure 7:
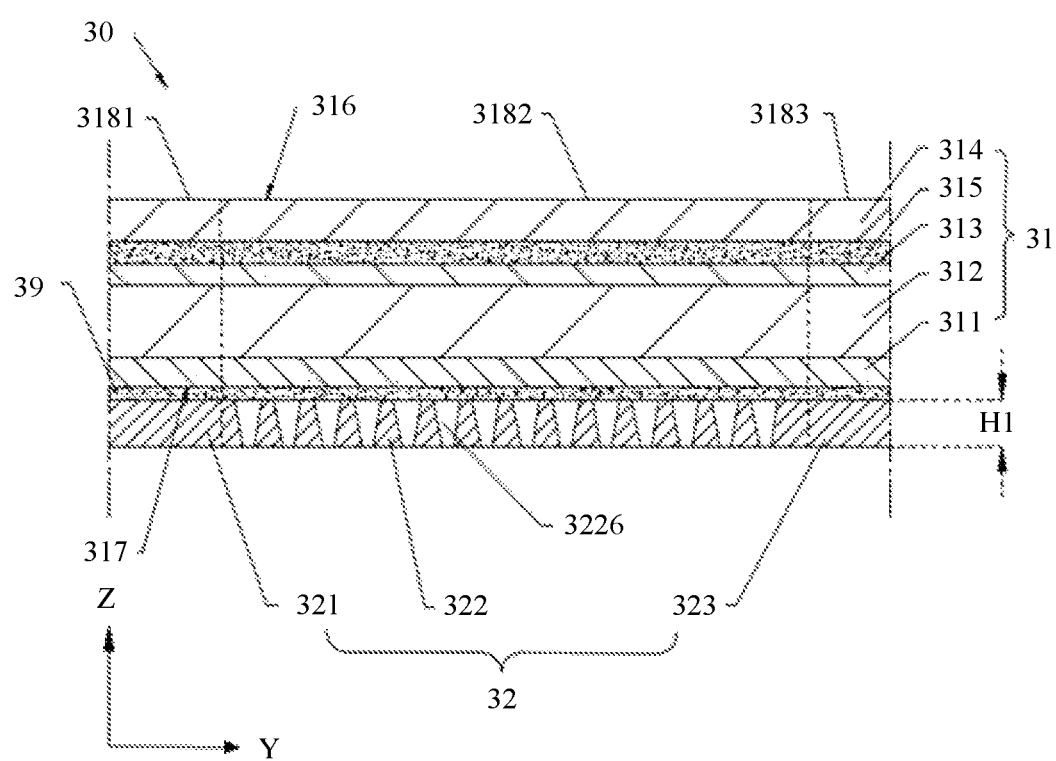
FIG. 7 is a partial schematic sectional view of an implementation of a display assembly of the electronic device shown in FIG. 4 at a line A-A.

Referring to FIG. 7, FIG. 7 is a partial schematic sectional view of an implementation of the display assembly of the electronic device shown in FIG. 4 at a line A-A. When the electronic device 100 is in the open state, the first non-bending region 3181, the bending region 3182, and the second non-bending region 3183 are approximately at 180° (where a slight deviation is allowed, for example, 165°, 177°, or 185°).

Referring to FIG. 7 again, the display screen 31 may include a rear film 311, a display panel 312, a polarizer (Polarizer, POL) 313, and a protective cover 314 that are sequentially stacked. In other words, the display panel 312 is located between the rear film 311 and the polarizer 313. The protective cover 314 is fastened to a surface, away from the display panel 312, of the polarizer 313. The rear film 311 may be configured to support the display panel 312. The display panel 312 is configured to display an image, a video, and the like. The protective cover 314 is configured to protect the polarizer 313, the display panel 312, and the like.

In addition, the display screen 31 further includes an optical clear adhesive 315. The optical clear adhesive 315 is fastened between the polarizer 313 and the protective cover 314. The optical clear adhesive 315 not only enables display light emitted by the display panel 312 to propagate outside the electronic device 100, but also improves flexibility of the display assembly 30.

In an implementation, the display screen 31 may be a touchscreen. The display screen 31 can be configured to generate a touch signal based on a touch action of a user. Specifically, when the user taps an icon of camera software on the display screen 31, the display screen 31 can generate a touch signal based on the tapping action of the user, and transmit the touch signal to a processor (not shown in the figure) of the electronic device 100. The processor receives the touch signal, and starts the camera software based on the touch signal. The processor may be installed in the first housing 10 (refer to FIG. 4), or may be installed in the second housing 20 (refer to FIG. 4).

The display panel 312 may have a touch function. In other words, the display panel 312 has a function of a touch panel. For example, the touch panel is embedded in a light emitting layer of the display panel 312 by using an on-cell technology. In another implementation, the display panel 312 may not have a touch function. In this case, the display screen 31 further includes a touch panel (not shown in the figure). The touch panel may be fastened between the protective cover 314 and the polarizer 313, or may be located between the polarizer 313 and the display panel 312.

Referring to FIG. 7 again, the display screen 31 includes an outer surface 316 and an inner surface 317 that are disposed opposite to each other. The outer surface 316 of the display screen 31 refers to a surface, facing the user, of the display screen 31 when the user normally uses the electronic device 100, namely, a display side of the display screen 31. The inner surface 317 of the display screen 31 refers to a surface, facing the interior of the electronic device 100, of the display screen 31 when the display assembly 30 is mounted on the first housing 10 and the second housing 20, namely, a non-display side of the display screen 31.

In addition, the support member 32 is fastened to the inner surface 317 of the display screen 31. The support member 32 is configured to support the display screen 31, to improve overall strength of the display assembly 30. In an implementation, the support member 32 may be fastened to the inner surface 317 of the display screen 31 by using an optical clear adhesive (OCA), a polyvinyl butyral (PVB) adhesive, a foam adhesive, a combination thereof, or the like. FIG. 7 shows that an optical clear adhesive 39 is disposed between the support member 32 and the inner surface 317 of the display screen 31.

Referring to FIG. 7 again, in the Z-axis direction, a height H1 of the support member 32 ranges from 0.1 mm to 0.5 mm. In this case, a thickness of the support member 32 is moderate, so that the support member 32 has better rigidity and flexibility, and the support member 32 does not greatly increase a thickness of the display assembly 30. In another embodiment, the height H1 of the support member 32 may alternatively be in another numerical range.

Referring to FIG. 5 again, the support member 32 includes a first metal plate 321, a second metal plate 322, and a third metal plate 323 that are sequentially connected. In other words, the second metal plate 322 is connected between the first metal plate 321 and the third metal plate 323. In FIG. 5, the first metal plate 321, the second metal plate 322, and the third metal plate 323 are distinguished by using dashed lines.

In an implementation, the first metal plate 321, the second metal plate 322, and the third metal plate 323 form an integrated structure. In other words, the first metal plate 321, the second metal plate 322, and the third metal plate 323 are an integral structure. In this case, connection firmness between the first metal plate 321, the second metal plate 322, and the third metal plate 323 is better. In addition, there are relatively few steps for forming the first metal plate 321, the second metal plate 322, and the third metal plate 323. This can reduce input costs of the support member 42.

Specifically, the first metal plate 321, the second metal plate 322, and the third metal plate 323 that are sequentially connected are formed on an integral plate by using a computer numerical control (CNC) machining process. In another implementation, the first metal plate 321, the second metal plate 322, and the third metal plate 323 that are sequentially connected may alternatively be formed by using an injection molding process, in a chemical etching manner, or another manner.

In another implementation, the first metal plate 321, the second metal plate 322, and the third metal plate 323 may alternatively be formed through welding or connected in a snap-fit fastening manner.

In an implementation, the first metal plate 321, the second metal plate 322, and the third metal plate 323 are formed in one step. It may be understood that the one-step forming includes manners such as extrusion forming, injection forming, die forming, and calendering forming. In this way, steps of a machining technology of the support member 32 are relatively few, and cost inputs of the support member 32 can be reduced.

Referring to FIG. 4 and FIG. 5, the first metal plate 321 is disposed facing the first bending region 3181. The first metal plate 321 is a part of the first part 34 of the display assembly 30. The second metal plate 322 is disposed facing the bending region 3182. The second metal plate 322 is a part of the second part 35. The third metal plate 323 is disposed facing the second non-bending region 3183. The third metal plate 323 is a part of the third part 36. The second metal plate 322 can be bent.

Referring to FIG. 6 again, when the electronic device 100 is in the closed state, the second metal plate 322 is bent, and the first metal plate 321 is disposed opposite to the third metal plate 323. FIG. 6 shows that the support member 32 is approximately water drop-shaped. In another implementation, the support member 32 may alternatively be annular.

Referring to FIG. 7 again, when the electronic device 100 is in the open state, the first metal plate 321, the second metal plate 322, and the third metal plate 323 are approximately at 180° (where a slight deviation is allowed, for example, 165°, 177°, or 185°). FIG. 7 shows that the first metal plate 321, the second metal plate 322, and the third metal plate 323 are at 180°.

The first metal plate 321, the second metal plate 322, and the third metal plate 323 are all made of a metal material. For example, the first metal plate 321, the second metal plate 322, and the third metal plate 323 may be made of copper, aluminum, beryllium copper, stainless steel, a titanium alloy, or the like. In this case, the first metal plate 321, the second metal plate 322, and the third metal plate 323 have better hardness and rigidity.

Figure 8:
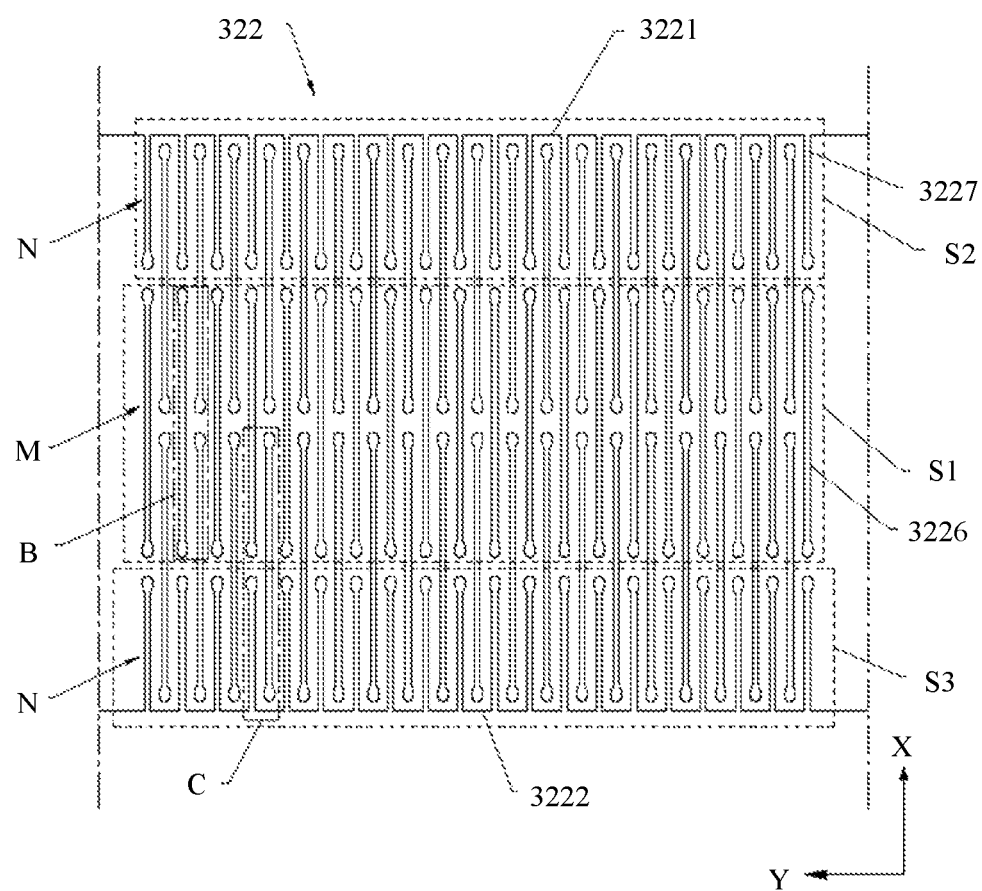
FIG. 8 is a schematic diagram of a partial structure of a second metal plate of the display assembly shown in FIG. 7.

Referring to FIG. 8, FIG. 8 is a schematic diagram of a partial structure of the second metal plate of the display assembly shown in FIG. 7. The second metal plate 322 is provided with at least two first elongated through hole groups M. FIG. 8 shows three first elongated through hole groups M. In addition, a region S1 circled by using dashed lines in FIG. 8 includes a lower half of a $1^{st}$ first elongated through hole group M, an entire $2^{nd}$ elongated through hole group M, and an upper half of a $3^{rd}$ first elongated through hole group M. A plurality of first elongated through hole groups M are arranged in the first direction. FIG. 8 shows that the first direction is the X-axis direction. Certainly, in another embodiment, the first direction may alternatively be any direction on an X-Y plane, for example, the Y-axis direction. It may be understood that the plurality of first elongated through hole groups M may be disposed parallel to the X-axis direction, but a slight deviation may be allowed, for example, 155°, 166°, or 177°.

In addition, each first elongated through hole group M includes a plurality of first elongated through holes 3226. The plurality of first elongated through holes 3226 are at intervals in the second direction. FIG. 8 shows that the second direction is the Y-axis direction. Certainly, in another embodiment, the second direction may alternatively be a direction on the X-Y plane. However, the second direction is different from the first direction. For example, when the first direction is the Y-axis direction, the second direction is the X-axis direction. It may be understood that in the Y-axis direction, the plurality of first elongated through holes 3226 may be disposed parallel to a Y-axis, but a slight deviation may be allowed, for example, 155°, 166°, or 177°. In addition, FIG. 7 shows sections of the first elongated through holes 3226 on a Y-Z plane. A shape of the first elongated through hole 3226 on the Y-Z plane is not limited to a trapezoid shown in FIG. 7. For example, the shape of the first elongated through hole 3226 on the Y-Z plane may alternatively be rectangular.

In addition, each first elongated through hole 3226 extends in the X-axis direction. It may be understood that an extension direction of the first elongated through hole 3226 may be parallel to the X-axis direction, but a slight deviation may also be allowed, for example, 155°, 166°, or 177°.

It may be understood that the second metal plate 322 is provided with the at least two first elongated through hole groups M, and each first elongated through hole group M includes the plurality of first elongated through holes 3226, so that excessive stress concentration of the second metal plate 322 is avoided, thereby ensuring that the second metal plate 322 has better flexibility. In other words, in a process of unfolding or folding the electronic device 100, because the second metal plate 322 has better flexibility, the second metal plate 322 has less impact on bending of the display screen 31.

Referring to FIG. 8 again, a plurality of first elongated through holes 3226 of two adjacent first elongated through hole groups M are arranged in a cross manner. FIG. 8 shows that an upper half of the first elongated through hole 3226 of the $2^{nd}$ first elongated through hole group M is located between two first elongated through holes 3226 of the $1^{st}$ first elongated through hole group M. In addition, a lower half of the first elongated through hole 3226 of the $2^{nd}$ first elongated through hole group M is located between two first elongated through holes 3226 of the $3^{rd}$ first elongated through hole group M. In this way, when sections are made in the Y-axis direction at most positions on the second metal plate 322, the second metal plate 322 is divided into a plurality of parts by the first elongated through holes 3226. In other words, the second metal plate 322 has no continuous part. In this case, the flexibility of the second metal plate 322 is further improved. In this way, in the process of unfolding or folding the electronic device 100, the second metal plate 322 has better flexibility, and the second metal plate 322 has less impact on the bending of the display screen 31. In another embodiment, a plurality of first elongated through holes 3226 of two adjacent first elongated through hole groups M are disposed at intervals from each other. In other words, the plurality of first elongated through holes 3226 of two adjacent first elongated through hole groups M do not overlap each other in the X-axis direction.

Figure 9:
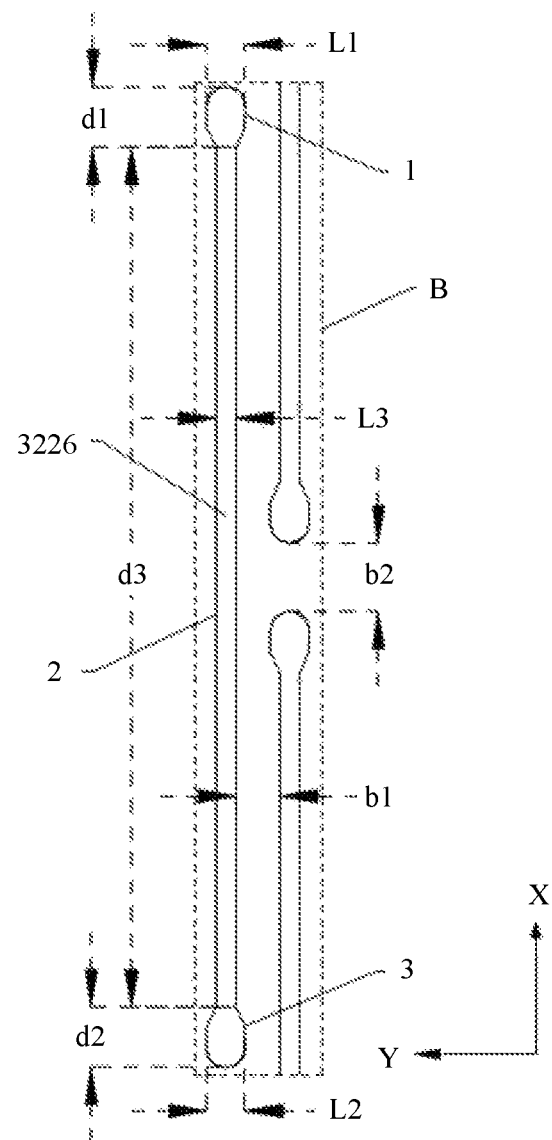
FIG. 9 is an enlarged schematic diagram of the second metal plate shown in FIG. 8 at a position B.

Referring to FIG. 9, FIG. 9 is an enlarged schematic diagram of the second metal plate shown in FIG. 8 at a position B. Each first elongated through hole 3226 includes a first end part 1, a middle part 2, and a second end part 3 that sequentially traverse through. In the Y-axis direction, a width of the first end part 1 is L1, a width of the second end part 3 is L2, and a width of the middle part 2 is L3. In this case, L1 is greater than L3, and L2 is greater than L3. It may be understood that the width L1 of the first end part 1 and the width L2 of the second end part 3 may be equal or unequal. In this case, the first elongated through hole 3226 is approximately dumbbell-shaped.

In an implementation, the first end part 1 and the second end part 3 are both circular holes. The middle part 2 is a strip-shaped hole. In this case, a preparation process of the first elongated through hole 3226 is simple and is easy to operate. In another implementation, the first end part 1 and the second end part 3 both may alternatively be special-shaped holes. The middle part 2 may alternatively be a trapezoidal hole.

It may be understood that, when the first elongated through hole 3226 is disposed in an approximate dumbbell shape, on one hand, because the width L3 of the middle part 2 of the first elongated through hole 3226 is relatively narrow, there is a relatively large quantity of remaining materials between two adjacent first elongated through holes 3226 in the Y-axis direction. In this way, the second metal plate 322 has sufficient strength. On another hand, because the width L1 of the first end part 1 and the width L2 of the second end part 3 are relatively wide, even if the width L3 of the middle part 2 is relatively narrow, a volume of the first elongated through hole 3226 is not reduced. In this way, when the second metal plate 322 has sufficient strength, the flexibility of the second metal plate 322 does not significantly decrease. In other words, hardness of the second metal plate 322 in this embodiment is moderate. It may be understood that, when the electronic device 100 is in the open state, the second metal plate 322 has sufficient hardness to support the bending region 3182 of the display screen 31, to prevent the bending region 3182 of the display screen 31 from collapsing, that is, ensure that the display screen 31 has better surface flatness. In the process of unfolding or folding the electronic device 100, because the second metal plate 322 has better flexibility, the second metal plate 322 has less impact on the bending of the display screen 31.

In addition, the first support plate 41, the second support plate 42, and the third support plate 43 of the rotating apparatus 40 are generally provided with a plurality of grooves or through holes. The groove or the through hole may be used as a shelter for a component or configured to lock a fastener. When the electronic device 100 is in the open state, if the user presses the screen 30, peripheral edges of the grooves or the through holes on the first support plate 41, the second support plate 42, and the third support plate 43 of the rotating apparatus 40 are prone to squeeze the second metal plate 322. Because stress of the peripheral edges of the grooves or the through holes is concentrated, a peripheral edge of the elongated through hole can squeeze the optical clear adhesive 39 with large squeezing force, the optical clear adhesive 39 protrudes, and the display screen 31 is prone to have problems such as a black spot or a bright line. In this case, when the second metal plate 322 has sufficient strength, the second metal plate 322 can resist the squeezing force, on the second metal plate 322, of the peripheral edges of the grooves or the through holes. Therefore, the optical clear adhesive 39 is prevented from protruding due to excessive squeezing, thereby avoiding the display screen 31 having the problems such as the black spot or the bright line.

Referring to FIG. 9 again, in the X-axis direction, a length of the first end part 1 is d1, a length of the second end part 3 is d2, and a length of the middle part 2 is d3. In an implementation, d1 is less than d3, and d2 is less than d3. It may be understood that the length d1 of the first end part 1 and the length d2 of the second end part 3 may be equal or unequal. In another implementation, d1 may alternatively be greater than or equal to d3, and d2 may alternatively be greater than or equal to d3.

In this implementation, the length d3 of the middle part 2 of the first elongated through hole 3226 is relatively long, and the length d1 of the first end part 1 and the length d2 of the second end part 3 are both relatively short. Therefore, the quantity of remaining materials between two adjacent first elongated through holes 3226 in the Y-axis direction further increases. In this way, the strength of the second metal plate 322 is better. In this way, when the second metal plate 322 has sufficient strength, the second metal plate 322 can resist the squeezing force, on the second metal plate 322, of the peripheral edges of the grooves or the through holes. Therefore, the optical clear adhesive 39 is prevented from protruding due to the excessive squeezing, thereby avoiding the display screen 31 having the problems such as the black spot or the bright line.

In an implementation, in the X-axis direction, the length d1 of the first end part 1 of the first elongated through hole 3226 ranges from 0.15 mm to 3 mm. For example, d1 is equal to 0.15 mm, 0.1 mm, 2 mm, 2.29 mm, or 3 mm. The length d2 of the second end part 3 of the first elongated through hole 3226 ranges from 0.15 mm to 3 mm. For example, d2 is equal to 0.15 mm, 0.11 mm, 2.1 mm, 2.29 mm, or 3 mm. The length d3 of the middle part 2 of the first elongated through hole 3226 ranges from 4.5 mm to 6.5 mm. For example, d3 is equal to 4.55 mm, 5 mm, 5.2 mm, 6 mm, or 6.5 mm.

In addition, in the Y-axis direction, the width L1 of the first end part 1 of the first elongated through hole 3226 ranges from 0.15 mm to 0.3 mm. For example, L1 is equal to 0.15 mm, 0.1 mm, 0.2 mm, 0.29 mm, or 0.3 mm. The width L2 of the second end part 3 of the first elongated through hole 3226 ranges from 0.15 mm to 0.3 mm. For example, L2 is equal to 0.15 mm, 0.1 mm, 0.2 mm, 0.29 mm, or 0.3 mm. The width L3 of the middle part 2 of the first elongated through hole 3226 ranges from 0.1 mm to 0.2 mm. For example, L3 is equal to 0.15 mm, 0.1 mm, 0.11 mm, 0.19 mm, or 0.2 mm.

It may be understood that, with the first elongated through hole 3226 in this size, the second metal plate 322 has both better flexibility and better strength.

Referring to FIG. 9 again, in the Y-axis direction, a width of a spacing part between two adjacent first elongated through holes 3226 of the second metal plate 322 is b1. In an implementation, b1 ranges from 0.2 mm to 0.3 mm. For example, b1 is equal to 0.2 mm, 0.22 mm, 0.26 mm, 0.29 mm, or 0.3 mm. In this way, in the Y-axis direction, there is a relatively large quantity of remaining materials between two adjacent first elongated through holes 3226, thereby ensuring that the second metal plate 322 has better strength.

Referring to FIG. 9 again, the X-axis direction, a length b2 of a spacing part between two adjacent first elongated through holes 3226 of the second metal plate 322 ranges from 0.2 mm to 0.6 mm. For example, b2 is equal to 0.4 mm, 0.44 mm, 0.5 mm, 0.55 mm, or 0.6 mm. In this way, in the X-axis direction, there is a relatively large quantity of remaining materials between two adjacent first elongated through holes 3226, thereby ensuring that the second metal plate 322 has better strength. In this case, when the peripheral edges of the grooves or the through holes on the first support plate 41, the second support plate 42, and the third support plate 43 of the rotating apparatus 40 squeeze the second metal plate 322, the second metal plate 322 has sufficient strength to resist the squeezing force, on the second metal plate 322, of the peripheral edges of the grooves or the through holes. Therefore, the optical clear adhesive 39 is prevented from protruding due to the excessive squeezing, thereby avoiding the display screen 31 having the problems such as the black spot or the bright line.

Refer to FIG. 8 again. The second metal plate 322 is provided with two second elongated through hole groups N disposed at intervals. The two second elongated through hole groups N are arranged in the first direction. FIG. 8 shows that the first direction is the X-axis direction. Certainly, in another embodiment, the first direction may alternatively be a direction on the X-Y plane, for example, the Y-axis direction. In addition, a region S2 circled by using dashed lines in FIG. 8 includes the entire $1^{st}$ second elongated through hole group N and an upper half of the $1^{st}$ first elongated through hole group M. A region S3 circled by using dashed lines in FIG. 8 includes an entire $2^{nd}$ second elongated through hole group N and the lower half of the third $1^{st}$ first elongated through hole group M.

In addition, in the X-axis direction, the second metal plate 322 includes a first side surface 3221 and a second side surface 3222. One second elongated through hole group N is disposed close to the first side surface 3221 of the second metal plate 322. Another second elongated through hole group N is disposed close to the second side surface 3222 of the second metal plate 322.

Each second elongated through hole group N includes a plurality of second elongated through holes 3227. A plurality of second elongated through holes 3227 in a same second elongated through hole group N are arranged at intervals in the second direction. FIG. 8 shows that the second direction is the Y-axis direction. Certainly, in another embodiment, the second direction may alternatively be any direction on the X-Y plane. However, the second direction is different from the first direction. For example, when the first direction is the Y-axis direction, the second direction is the X-axis direction. It may be understood that an arrangement direction of the plurality of second elongated through holes 3227 of the same second elongated through hole group N may be parallel to the Y-axis direction, but a slight deviation may be allowed, for example, 155°, 166°, or 177°. In addition, each second elongated through hole 3227 of the $1^{st}$ second elongated through hole group N penetrates the first side surface 3221 of the second metal plate 322, and each second elongated through hole 3227 of the $2^{nd}$ second elongated through hole group N penetrates the second side surface 3222 of the second metal plate 322.

In addition, each second elongated through hole 3227 extends in the X-axis direction. It may be understood that an extension direction of the second elongated through hole 3227 may be parallel to the X-axis direction, but a slight deviation may also be allowed, for example, 155°, 166°, or 177°.

It may be understood that the second metal plate 322 is provided with the two second elongated through hole groups N, and each second elongated through hole group N includes the plurality of second elongated through holes 3227, so that the excessive stress concentration of the second metal plate 322 is further avoided, to ensure that the second metal plate 322 has better flexibility. In other words, in the process of unfolding or folding the electronic device 100, because the second metal plate 322 has better flexibility, the second metal plate 322 has less impact on the bending of the display screen 31.

In addition, each second elongated through hole 3227 of the one second elongated through hole group N penetrates the first side surface 3221 of the second metal plate 322, and each second elongated through hole 3227 of the another second elongated through hole group N penetrates the second side surface 3222 of the second metal plate 322, so that local stress concentration on a side part of the second metal plate 322 is prevented. In this case, in the process of unfolding or folding the electronic device 100, the second elongated through hole 3227 can absorb stress of the display assembly 30 in a bending process. In other words, this avoids that the display assembly 30 is difficultly bent due to excessive stress on the side part of the second metal plate 322.

In addition, the second elongated through holes 3227 and one first elongated through hole group M are arranged crosswise to each other. FIG. 8 shows that each second elongated through hole 3227 is located between two first elongated through holes 3226. In other words, each second elongated through hole 3227 overlaps the first elongated through hole 3226. In this way, when sections are made in the Y-axis direction at any position on the second metal plate 322, the second metal plate 322 is divided into a plurality of parts by the first elongated through holes 3226. In other words, the second metal plate 322 has no continuous part. In this case, the flexibility of the second metal plate 322 is significantly improved.

In another implementation, the second elongated through holes 3227 and one first elongated through hole group M are arranged at intervals from each other. In other words, each second elongated through hole 3227 and each first elongated through hole 3226 do not overlap each other in the X-axis direction.

Figure 10:
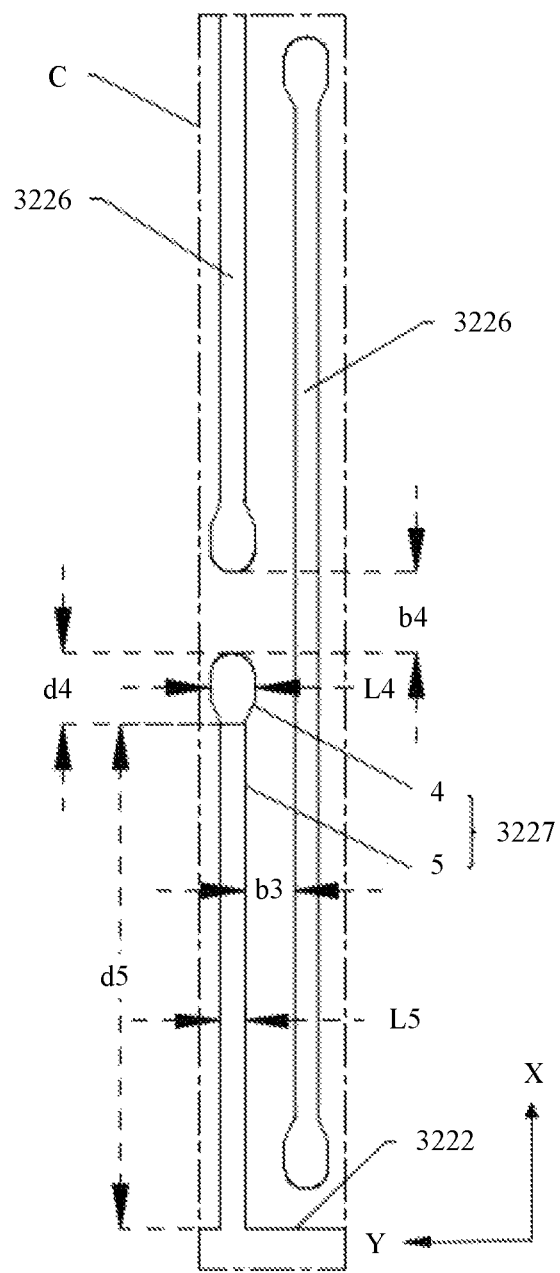
FIG. 10 is an enlarged schematic diagram of the second metal plate shown in FIG. 8 at a position C.

Referring to FIG. 10, each second elongated through hole 3227 includes a third end part 4 and a main part 5 that traverse through with each other. An end part, away from the third end part 4, of the main part 5 penetrates the first side surface 3221 or the second side surface 3222 of the second metal plate 322. FIG. 10 shows that the main part 5 of the second elongated through hole 3227 of the $2^{nd}$ second elongated through hole group N penetrates the second side surface 3222.

In the Y-axis direction, a width of the third end part 4 is L4, and a width of the main part 5 is L5. L4 is greater than L5. In this case, the second elongated through hole 3227 is approximately match-shaped.

In an implementation, the third end part 4 is a circular hole, and the main part 5 is a strip-shaped hole. In this case, a preparation process of the second elongated through hole 3227 is simple and is easy to operate. In another implementation, all the third end parts 4 may be special-shaped holes, and the main part 5 may alternatively be a trapezoidal hole.

In this implementation, when the second elongated through hole 3227 is disposed in an approximate match shape, on one hand, because the width L5 of the main part 5 of the second elongated through hole 3227 is relatively narrow, there is a relatively large quantity of remaining materials between the second elongated through hole 3227 and an adjacent first elongated through hole 3226 in the Y-axis direction. In this way, the strength of the second metal plate 322 is further improved. On another hand, because the width L4 of the third end part 4 is relatively wide, even if the width L5 of the main part 5 is relatively narrow, a volume of the second elongated through hole 3227 is not reduced. In this way, when the second metal plate 322 has sufficient strength, the flexibility of the second metal plate 322 does not significantly decrease.

Referring to FIG. 10 again, the X-axis direction, a length of the third end part 4 is d4, and a length of the main part 5 is d5. In an implementation, d4 is less than d5. In another implementation, d4 may alternatively be greater than or equal to d5.

In this implementation, the length d4 of the main part 5 of the second elongated through hole 3227 is relatively long, and the length d4 of the third end part 4 is relatively short. Therefore, the quantity of remaining materials between two adjacent second elongated through holes 3227 in the Y-axis direction further increases. In this way, the strength of the second metal plate 322 is better. In this way, when the second metal plate 322 has sufficient strength, the second metal plate 322 can resist the squeezing force, on the second metal plate 322, of the peripheral edges of the grooves or the through holes. Therefore, the optical clear adhesive 39 is prevented from protruding due to the excessive squeezing, thereby avoiding the display screen 31 having the problems such as the black spot or the bright line.

In an implementation, in the X-axis direction, the length d4 of the third end part 4 ranges from 0.15 mm to 3 mm, and the length d5 of the main part 5 ranges from 4.5 mm to 6.5 mm. In the Y-axis direction, the width L4 of the third end part 4 ranges from 0.15 mm to 0.3 mm, and the width L5 of the main part 5 ranges from 0.1 mm to 0.2 mm. It may be understood that, with the second elongated through hole 3227 in this size, the second metal plate 322 has both better flexibility and better strength.

Referring to FIG. 10 again, in the Y-axis direction, a width of a spacing part that is of the second metal plate 322 and that is located between the second elongated through hole 3227 and the adjacent first elongated through hole 3226 is b3. In an implementation, b3 ranges from 0.2 mm to 0.3 mm. For example, b3 is equal to 0.2 mm, 0.22 mm, 0.26 mm, 0.29 mm, or 0.3 mm. In this way, in the Y-axis direction, there is a relatively large quantity of remaining materials between the second elongated through hole 3227 and the adjacent first elongated through hole 3226, thereby ensuring that the second metal plate 322 has better strength.

Referring to FIG. 10 again, in the X-axis direction, a length of a spacing part that is of the second metal plate 322 and that is located between the second elongated through hole 3227 and the first elongated through hole 3226 is b4. In an implementation, b4 ranges from 0.4 mm to 0.6 mm. For example, b4 is equal to 0.4 mm, 0.44 mm, 0.5 mm, 0.55 mm, or 0.6 mm. In this way, in the X-axis direction, there is a relatively large quantity of remaining materials between the second elongated through hole 3227 and the first elongated through hole 3226, thereby ensuring that the second metal plate 322 has better strength.

Figure 11:
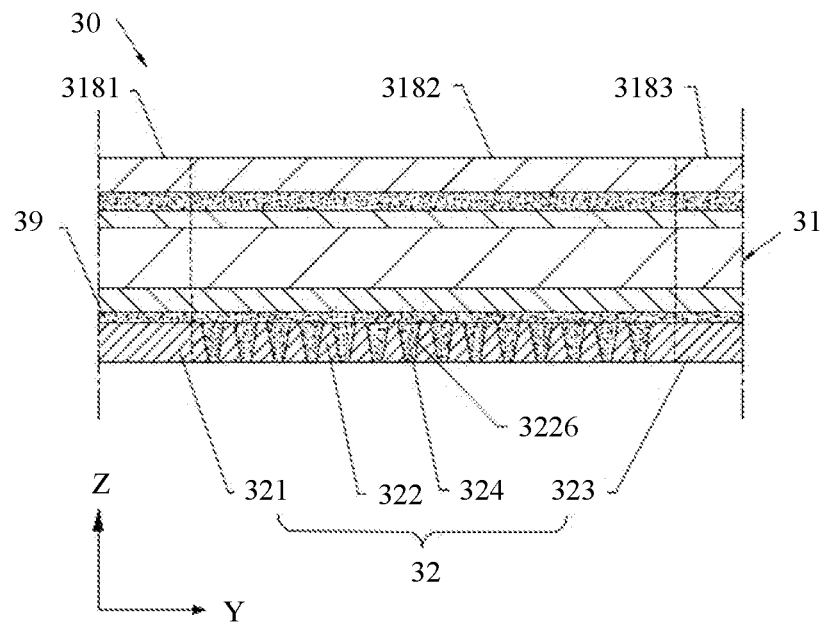
FIG. 11 is a partial schematic sectional view of another implementation of a display assembly of the electronic device shown in FIG. 4 at a line A-A.

Referring to FIG. 11, FIG. 11 is a partial schematic sectional view of another implementation of the display assembly of the electronic device shown in FIG. 4 at the line A-A. The support member 32 further includes buffers 324, and the buffers 324 are disposed in the first elongated through holes 3226 and connected to the second metal plate 322. The buffer 324 may be made from a polymer material, for example, thermoplastic polyurethane (Thermoplastic polyurethane, TPU) rubber, a thermoplastic elastomer (Thermoplastic Elastomer, TPE), or rubber. The buffer 324 has better flexibility. The buffer 324 may fill a part of the first elongated through hole 3226, or may fill the entire first elongated through hole 3226. In this way, in the process of unfolding or folding the electronic device 100, the second metal plate 322 has less impact on the bending of the display screen 31. In another embodiment, the buffer 324 may also be disposed in each second elongated through hole 3227.

It may be understood that, when the peripheral edges of the grooves or the through holes on the first support plate 41, the second support plate 42, and the third support plate 43 of the rotating apparatus 40 squeeze the second metal plate 322, the buffer 324 can absorb squeezing force, on the second metal plate 322, of peripheral edges of some grooves or through holes. Therefore, the optical clear adhesive 39 is prevented from protruding due to the excessive squeezing, thereby avoiding the display screen 31 having the problems such as the black spot or the bright line.

In addition, no hollow region due to the first elongated through hole 3226 exists on the support 324, so that the support 324 has high integrity. In this way, the support 324 has sufficient strength to resist the squeezing force, on the second metal plate 322, of the peripheral edges of the grooves or the through holes. Therefore, the optical clear adhesive 39 is prevented from protruding due to the excessive squeezing, thereby avoiding the display screen 31 having the problems such as the black spot or the bright line.

Figure 12:
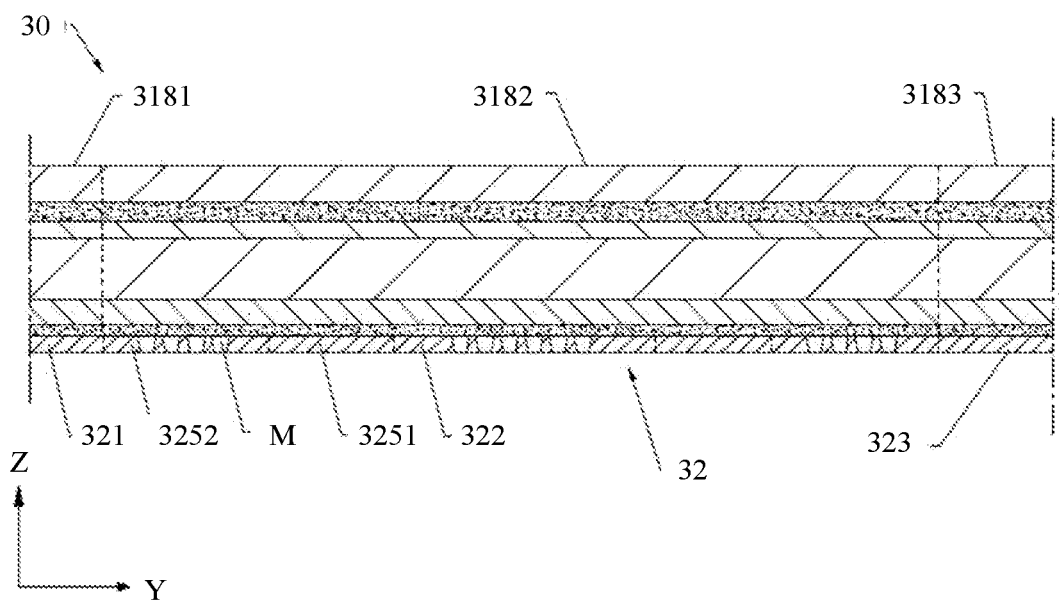
FIG. 12 is a partial schematic sectional view of another implementation of a display assembly of the electronic device shown in FIG. 4 at a line A-A.

Referring FIG. 12, FIG. 12 is a partial schematic sectional view of another implementation of the display assembly of the electronic device shown in FIG. 4 at the line A-A. The support member 32 further includes a fourth metal plate 3252 and a fifth metal plate 3251 that face the bending region 3182 of the display screen 31. The first metal plate 321, the fourth metal plate 3252, the fifth metal plate 3251, the second metal plate 322, and the third metal plate 323 are sequentially connected.

The fourth metal plate 3252 is provided with a plurality of first elongated through hole groups M. It may be understood that, for a manner of disposing the first elongated through hole group M in this implementation, refer to a manner of disposing the first elongated through hole group M in the foregoing implementations. Details are not described herein again. In addition, two second elongated through hole groups N may also be disposed in this implementation. For details, refer to a manner of disposing the second elongated through hole group N in the foregoing implementations. Details are not described herein again. In addition, for a manner of disposing the fifth metal plate 3251, refer to a manner of disposing the first metal plate 321 in the foregoing implementations. Details are not described herein again.

In this implementation, because the fourth metal plate 3252 is provided with the plurality of first elongated through hole groups M, overall hardness and rigidity of the fourth metal plate 3252 are moderate. In other words, some regions of the support member 32 have better flexibility. In this case, a quantity of regions of the support member 32 that have better flexibility may increase. Therefore, when the support member 32 is fastened to the display screen 31, the fourth metal plate 3252 may also be fastened to a region with a larger bending angle in the bending region 3182 of the display screen 31, to ensure that the bending region of the display screen 31 has a better bending effect. In addition, the fifth metal plate 3251 may be fastened to a region with a smaller bending angle in the bending region 3182 of the display screen 31, to ensure that the support member 32 has sufficient strength to support the display screen 31.

In another implementation, the support member 32 may further include a sixth metal plate, a seventh metal plate, . . ., and an $S^{th}$ metal plate. S is an integer greater than or equal to 7. At least one metal plate is provided with a first elongated through hole group M. At least one metal plate is not provided with the first elongated through hole group M.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A display assembly, comprising a display screen and a support member, wherein the display screen comprises a first non-bending region, a bending region, and a second non-bending region that are sequentially connected, the support member is fastened to a non-display side of the display screen, the support member comprises a first metal plate, a second metal plate, and a third metal plate that are sequentially connected, the first metal plate is disposed facing the first non-bending region, the second metal plate is disposed facing the bending region, the third metal plate is disposed facing the second non-bending region, and the second metal plate is capable of being bent;

the second metal plate is provided with at least two first elongated through hole groups, the at least two first elongated through hole groups are arranged in a first direction, each first elongated through hole group comprises a plurality of first elongated through holes, each first elongated through hole extends in the first direction, a plurality of first elongated through holes in a same first elongated through hole group are arranged at intervals in a second direction different from the first direction; and each first elongated through hole comprises a first end part, a middle part, and a second end part that sequentially traverse through, wherein in the second direction, widths of the first end part and the second end part both range from 0.15 mm to 0.3 mm, a width of the middle part ranges from 0.1 mm to 0.2 mm, and in the second direction, each of the widths of the first end part and the second end part is greater than the width of the middle part; and wherein in the first direction, lengths of the first end part and the second end part both range from 0.15 mm to 3 mm, and a length of the middle part ranges from 4.5 mm to 6.5 mm.

2. The display assembly according to claim 1, wherein in the first direction, a length of the first end part is less than a length of the middle part, and a length of the second end part is less than the length of the middle part.

3. The display assembly according to claim 2, wherein in the second direction, a width of a spacing part between two adjacent first elongated through holes of the second metal plate ranges from 0.2 mm to 0.3 mm.

4. The display assembly according to claim 2, wherein in the first direction, a length of a spacing part between two adjacent first elongated through holes of the second metal plate ranges from 0.4 mm to 0.6 mm.

5. The display assembly according to claim 1, wherein a plurality of first elongated through holes of two adjacent first elongated through hole groups are disposed in a cross manner.

6. The display assembly according to claim 1, wherein the second metal plate is provided with two second elongated through hole groups, each second elongated through hole group comprises a plurality of second elongated through holes extending in the first direction, and a plurality of second elongated through holes in a same second elongated through hole group are arranged at intervals in the second direction; and in the first direction, the second metal plate comprises a first side surface and a second side surface that are disposed opposite to each other, one second elongated through hole group is disposed close to the first side surface and each second elongated through hole penetrates the first side surface, and another second elongated through hole group is disposed close to the second side surface and each second elongated through hole penetrates the second side surface.

7. The display assembly according to claim 6, wherein each second elongated through hole comprises a third end part and a main part that traverse through with each other, the main part penetrates the first side surface or the second side surface, and in the second direction, a width of the third end part is greater than a width of the main part.

8. The display assembly according to claim 7, wherein in the first direction, a length of the third end part is less than a length of the main part.

9. The display assembly according to claim 1, wherein the support member further comprises a fourth metal plate and a fifth metal plate that face the bending region of the display screen, and the first metal plate, the fourth metal plate, the fifth metal plate, the second metal plate, and the third metal plate are sequentially connected; and the fourth metal plate is provided with at least two first elongated through hole groups.

10. The display assembly according to claim 1, wherein a thickness of the support member ranges from 0.1 mm to 0.5 mm.

11. The display assembly according to claim 1, wherein the support member further comprises buffers, and the buffers are disposed in the first elongated through holes, and are connected to the second metal plate.

12. An electronic device, comprising a first housing, a second housing, and a display assembly that comprises a display screen and a support member;

wherein the display screen comprises a first non-bending region, a bending region, and a second non-bending region that are sequentially connected, the support member is fastened to a non-display side of the display screen, the support member comprises a first metal plate, a second metal plate, and a third metal plate that are sequentially connected, the first metal plate is disposed facing the first non-bending region, the second metal plate is disposed facing the bending region, the third metal plate is disposed facing the second non-bending region, and the second metal plate is capable of being bent;

the second metal plate is provided with at least two first elongated through hole groups, the at least two first elongated through hole groups are arranged in a first direction, each first elongated through hole group comprises a plurality of first elongated through holes, each first elongated through hole extends in the first direction, a plurality of first elongated through holes in a same first elongated through hole group are arranged at intervals in a second direction different from the first direction; and each first elongated through hole comprises a first end part, a middle part, and a second end part that sequentially traverse through, wherein in the second direction, widths of the first end part and the second end part both range from 0.15 mm to 0.3 mm, a width of the middle part ranges from 0.1 mm to 0.2 mm, and in the second direction, each of the widths of the first end part and the second end part is greater than the width of the middle part; wherein in the first direction, lengths of the first end part and the second end part both range from 0.15 mm to 3 mm, and a length of the middle part ranges from 4.5 mm to 6.5 mm; and wherein the first non-bending region of the display screen is fastened to the first housing; the second non-bending region is fastened to the second housing; the first housing and the second housing are capable of being folded relative to each other to a closed state, or unfolded relative to each other to an open state; and when the first housing and the second housing are in the closed state, the bending region and the second metal plate are bent.

13. The electronic device according to claim 12, wherein in the first direction, a length of the first end part is less than a length of the middle part, and a length of the second end part is less than the length of the middle part.

14. The electronic device according to claim 13, wherein in the second direction, a width of a spacing part that is of the second metal plate and that is located between two adjacent first elongated through holes ranges from 0.2 mm to 0.3 mm.

15. The electronic device according to claim 13, wherein in the first direction, a length of a spacing part that is of the second metal plate and that is located between two adjacent first elongated through holes ranges from 0.4 mm to 0.6 mm.

16. The electronic device according to claim 12, wherein a plurality of first elongated through holes of two adjacent first elongated through hole groups are disposed in a cross manner.

17. The electronic device according to claim 12, wherein the second metal plate is provided with two second elongated through hole groups, each second elongated through hole group comprises a plurality of second elongated through holes extending in the first direction, and a plurality of second elongated through holes in a same second elongated through hole group are arranged at intervals in the second direction; and in the first direction, the second metal plate comprises a first side surface and a second side surface that are disposed opposite to each other, one second elongated through hole group is disposed close to the first side surface and each second elongated through hole penetrates the first side surface, and another second elongated through hole group is disposed close to the second side surface and each second elongated through hole penetrates the second side surface.

18. The electronic device according to claim 17, wherein each second elongated through hole comprises a third end part and a main part that communicate with each other, the main part penetrates the first side surface or the second side surface, and in the second direction, a width of the third end part is greater than a width of the main part.

* * * * *